(12) United States Patent
Harada

(10) Patent No.: US 6,777,332 B2
(45) Date of Patent: Aug. 17, 2004

(54) METHOD FOR FORMING WIRING STRUCTURE

(75) Inventor: Takeshi Harada, Shiga (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/454,680

(22) Filed: Jun. 5, 2003

(65) Prior Publication Data

US 2003/0232498 A1 Dec. 18, 2003

(30) Foreign Application Priority Data

Jun. 13, 2002 (JP) ........................................ 2002-172310

(51) Int. Cl.[7] .............................................. H01L 21/44
(52) U.S. Cl. ...................... 438/687; 438/675; 257/775
(58) Field of Search ...................... 438/660, 669–675, 438/687–693, 700; 257/762, 773–775

(56) References Cited

U.S. PATENT DOCUMENTS 6,188,120 B1 * 2/2001 Andricacos et al. ........ 257/532
6,218,302 B1 * 4/2001 Braeckelmann et al. .... 438/687

FOREIGN PATENT DOCUMENTS

JP 11-186261 7/1999

* cited by examiner

*Primary Examiner*—Caridad Everhart
*Assistant Examiner*—Calvin Lee
(74) *Attorney, Agent, or Firm*—McDermott Will & Emery LLP

(57) ABSTRACT

A recess is formed in an insulating film, and then a conductive film is deposited over the insulating film so as to fill the recess. Thereafter, a heat treatment is performed on the conductive film. Subsequently, the conductive film is partly removed both before and after the step of performing the heat treatment.

21 Claims, 8 Drawing Sheets

METHOD FOR FORMING WIRING STRUCTURE

BACKGROUND OF THE INVENTION

The present invention relates to methods for forming wiring structures in electronic devices such as semiconductor devices.

Examples of known methods for forming wiring structures include a prior art (see, for example, Japanese Laid-Open Publication No. 11-186261) in which heat treatment (hereinafter, referred to as annealing) is performed after a chemical mechanical polishing (CMP) process. Hereinafter, the prior art method for forming a wiring structure will be described with reference to the drawings with the case where wire is formed in a wiring groove formed in an insulating film taken an example.

FIGS. 13A through 13E are cross-sectional views showing respective process steps of a method for forming a wiring structure according to the prior art.

First, as shown in FIG. 13A, an underlying oxide film 12 is deposited by a plasma CVD (chemical vapor deposition) process over a silicon substrate 11, and then a SiN film 13 and a $SiO_2$ film 14 are deposited in this order with similar processes. Subsequently, the $SiO_2$ film 14 is etched using a resist pattern (not shown) as a mask, thereby forming a recess reaching the SiN film 13. Thereafter, the resist pattern and the exposed part of the SiN film 13 are removed, thereby forming a wiring groove 15.

Next, as shown in FIG. 13B, a barrier metal TaN film 16 is deposited by a sputtering process over the $SiO_2$ film 14 provided with the wiring groove 15, and then a Cu seed film 17 is deposited over the barrier metal TaN film 16.

Thereafter, as shown in FIG. 13C, a Cu plating layer 18 is deposited by an electrolytic plating process over the $SiO_2$ film 14 to fill the wiring groove 15 completely.

Subsequently, as shown in FIG. 13D, respective parts of the Cu plating layer 18, Cu seed film 17 and barrier metal TaN film 16 located outside the wiring groove 15 are removed by a CMP process, thereby exposing the surface of the $SiO_2$ film 14. In this manner, a Cu buried wiring layer 19 is formed in the wiring groove 15.

Then, an annealing process is performed at a temperature of 300 to 500° C. for a holding time of 5 to 2000 seconds, thereby eliminating, for example, moisture, hydrogen and carbon dioxide contained in the Cu buried wiring layer 19 as well as increasing the grain size of the Cu buried wiring layer 19, as shown in FIG. 13E.

Through the foregoing process steps, a copper wire for a semiconductor device is formed.

However, the prior art has a problem described later.

FIG. 14 is a view for explaining the problem in the prior art.

As shown in FIG. 14, a SiN film 43, a $SiO_2$ film 44 and a FSG film (fluorine-doped silicon oxide film) 45 are formed in this order over an insulating film 41 in which a lower wiring layer 42 is buried. The SiN film 43, the $SiO_2$ film 44 and the FSG film 45 are provided with a recess 46 and a wiring groove 47. More specifically, the recess 46 is made up of: a via hole 46a formed through the SiN film 43 and the $SiO_2$ film 44 to reach the lower wiring layer 42; and a wiring groove 46b formed in the FSG film 45 and connected to the via hole 46a. The wiring groove 47 is also formed in the FSG film 45 in the same manner as the wiring groove 46b. The recess 46 and the wiring groove 47 are filled with a copper film (a conducive film for upper wiring) 49 that is surrounded by a barrier film 48. A SiN film 50 is formed on the FSG film 45 and the copper film 49.

In the prior art, however, if the copper film 49 is annealed after a CMP process (see FIG. 13D) in a process for forming wiring, there arises a problem that surface defects such as a surface fracture 51 and a crack 52 are created in the surface of the copper film 49 buried in, for example, the recess 46, as shown in FIG. 14.

SUMMARY OF THE INVENTION

It is therefore an object of the present invention to provide a method for preventing the occurrence of surface defects in a conductive film for wiring and thus fabricating an electronic device such as a semiconductor device with a highly-reliable wiring structure with a good yield.

In order to achieve this object, the present inventor has studied causes of the surface fracture 51 and the crack 52 occurring in the prior art in which "annealing" is performed "after a CMP process" to obtain the following findings. That is to say, in the prior art, the copper film 49 buried in, for example, the recess 46 is annealed so that the crystallization of the copper film 49 is completed. Accordingly, defects (e.g., vacancies at the atomic level existing along a grain boundary) contained in the copper film 49 gather in the surface of the copper film 49, which has been already planarized, and in addition, the copper film 49 shrinks unevenly. As a result, the surface fracture 51 and the crack 52 occur as shown in FIG. 14. Although the SiN film 50 is deposited over the entire surface of the wiring structure including the copper film 49 after the formation of the structure in the prior art, the surface fracture 51 and the crack 52 are not filled with the SiN film 50 because the SiN film 50 has a low step coverage. Therefore, the surface defects such as the surface fracture 51 created in the surface of the copper film 49 to serve as wiring are left without being treated. As a result, these surface defects act as paths for surface diffusion of copper atoms, thus greatly deteriorating resistance to electromigration.

In view of this, the present inventor has come up with a method for forming a highly-reliable wiring structure by performing "CMP processes" separately "before and after an annealing process" in order to simultaneously remove the surface defects created in a conductive film for wiring during the annealing process and a surface portion of the conductive film for wiring.

Specifically, an inventive method for forming a wiring structure includes the steps of: forming a recess in an insulating film; depositing a conductive film over the insulating film such that the recess is filled with the conductive film; performing a heat treatment on the conductive film; partly removing the conductive film before the step of performing the heat treatment is performed; and partly removing the conductive film after the step of performing the heat treatment has been performed.

With the inventive method for forming a wiring structure, after a conductive film has been deposited to fill a recess provided in an insulating film, the conductive film is subjected to a heat treatment, and then the conductive film is partly removed before and after the heat treatment. That is to say, the conductive film is partly removed before a heat treatment and the remaining conductive film is subjected to the heat treatment, thereby retaining the hardness of the conductive film such that the conductive film is removed relatively evenly in a removing step after the heat treatment. In addition, the conductive film is also partially removed after the heat treatment, thereby simultaneously eliminating defects such as a surface fracture or crack created in the conduction film during the heat treatment. Accordingly, no path for surface diffusion of atoms constituting the conductive film is created, thus preventing deterioration of the electromigration resistance of the wiring structure. As a result, an electronic device such as a semiconductor device with a highly-reliable wiring structure can be fabricated with a good yield.

In the inventive method for forming a wiring structure, the step of removing the conductive film partly (e.g., a CMP process) performed after the heat treatment allows surface defects such as a fracture created in the conductive film to be removed at a time. In other words, it is possible to remove the surface defects without specially setting conditions for the heat treatment, thus forming a highly-reliable wiring structure without increasing the number of process steps.

The inventive method for forming a wiring structure may include the step of depositing a barrier film over the insulating film so that the recess is halfway filled with the barrier film, before the step of depositing the conductive film is performed, wherein the step of partly removing the conductive film before the step of performing the heat treatment may include the step of removing part of the conductive film located outside the recess, thereby exposing part of the barrier film located outside the recess, and the step of partly removing the conductive film after the step of performing the heat treatment may include the step of removing the part of the barrier film located outside the recess and a surface portion of the remaining conductive film.

Then, more suitable conditions for films to be polished can be selected in respective removing steps, e.g., conditions suitable for polishing the conductive film are selected in the removing step before the heat treatment whereas conditions suitable for polishing the barrier film are selected in the removing step after the heat treatment. Accordingly, insufficient polishing or excessive polishing is less liable to occur. As a result, polishing can be performed with higher accuracy and a margin required for polishing can be reduced, thereby enabling a flexible process design.

In such a case, if the conductive film is made of copper or an alloy containing copper and the barrier film is made of Ta or TaN, then highly-reliable buried copper wiring is achieved.

The inventive method for forming a wiring structure may include the step of depositing a barrier film over the insulating film so that the recess is halfway filled with the barrier film, before the step of depositing the conductive film is performed, wherein the step of partly removing the conductive film before the step of performing the heat treatment may include the step of partially removing part of the conductive film located outside the recess, and the step of partly removing the conductive film after the step of performing the heat treatment may include the step of removing the part of the conductive film remaining outside the recess and part of the barrier film located outside the recess.

Then, even if a surface fracture or a crack is enlarged resulting from film properties of the conductive film, the surface of the conductive film can be further planarized because the amount of removal of the conductive film is set large in the removing step after the heat treatment.

In such a case, if the conductive film is made of copper or an alloy containing copper and the barrier film is made of Ta or TaN, then highly-reliable buried copper wiring is achieved.

The inventive method for forming a wiring structure may include the step of depositing a barrier film over the insulating film so that the recess is halfway filled with the barrier film, before the step of depositing the conductive film is performed, wherein the step of partly removing the conductive film before the step of performing the heat treatment may include the step of removing part of the conductive film located outside the recess and part of the barrier film located outside the recess, and the step of partly removing the conductive film after the step of performing the heat treatment may include the step of removing a surface portion of the remaining conductive film.

Then, in the removing step after the heat treatment (i.e., the step of removing a surface portion of the remaining conductive film), even if conditions suitable for removing an insulating film such as an oxide film is selected, other than the conditions suitable for removing the conductive film and the conditions suitable for removing the barrier film, it is possible to obtain the effect of smoothing the surface of the conductive film. Specifically, in the case where an oxide film around the wiring is removed by CMP using conditions suitable for removing an oxide film, a strong force is also applied to the conductive film for wiring, so that the surface of the conductive film is planarized simultaneously with the removal of the oxide film.

In such a case, if the conductive film is made of copper or an alloy containing copper and the barrier film is made of Ta or TaN, then highly-reliable buried copper wiring is achieved.

In the inventive method for forming a wiring structure, the recess may include: a via hole; and a wiring groove formed on the via hole and connected to the via hole. Then, a highly-reliable wiring structure having a dual damascene structure is achieved.

In the inventive method for forming a wiring structure, the heat treatment is preferably performed at a temperature higher than or equal to 200° C. and less than 500° C.

Then, the crystal of the conductive film is fully grown inside the recess, thereby densifying the conductive film. Accordingly, in a heat treatment performed after the formation of the wiring structure, further crystal growth of the conductive film does not occur inside the recess, thus preventing the shrinkage of the conductive film and the occurrence of, for example, a surface fracture due to the shrinkage.

In the inventive method for forming a wiring structure, if the recess has a width of 0.25 μm or less, the above-described advantages are remarkably exhibited.

In the inventive method for forming a wiring structure, if the conductive film is made of copper or an alloy containing copper, highly-reliable buried copper wiring is achieved.

In the inventive method for forming a wiring structure, if in the steps of partly removing the conductive film, a chemical mechanical polishing process is used, part of the conductive film outside the recess can be removed as intended.

An inventive method for fabricating an electronic device is predicated upon a method for fabricating an electronic device including a first wiring structure and a second wiring structure. Specifically, a method for forming the first wiring structure includes the steps of: forming a first recess in a first insulating film; depositing a first conductive film over the first insulating film such that the first recess is filled with the first conductive film; performing a heat treatment on the first conductive film; partly removing the first conductive film before the step of performing the heat treatment is performed; and partly removing the first conductive film after the step of performing the heat treatment has been performed. A method for forming the second wiring structure includes the steps of: forming a second recess in a second insulating film; depositing a second conductive film over the second insulating film such that the second recess is filled with the second conductive film; performing a heat treatment on the second conductive film; and removing part of the second conductive film located outside the second recess. In the inventive method for fabricating an electronic device, the second recess has a width greater than the first recess. In the method for fabricating the second wiring structure, part of the second conductive film located outside the second recess may be removed before or after the heat treatment performed on the second conductive film.

With the inventive method for fabricating an electronic device, the inventive method for forming a wiring structure is used to form a first wiring structure in a first recess with a relatively small width of 0.25 μm or less, for example, and therefore the above-described advantages of the method are also obtained. On the other hand, to form a second wiring structure in a second recess with a relatively large width greater than 0.25 μm, for example, "a CMP process" is performed only one time "before annealing" or "after annealing", considering that defects are easily released from part of the conductive film inside the wide recess. Accordingly, it is possible to achieve a wiring structure without any surface defect such as a surface fracture, while suppressing the complication of the process.

That is to say, with the inventive method for fabricating an electronic device, the timing of and the number of a CMP process for forming a wiring structure are selectively set in accordance with the width of the recess, i.e., the wiring width, so that it is possible to form a desired wiring structure, without complicating the process excessively.

DESCRIPTION OF THE PREFERRED EMBODIMENTS

Embodiment 1

Hereinafter, a method for fabricating an electronic device according to a first embodiment of the present invention will be described with reference to the drawings. This embodiment is characterized in that an annealing process is performed on a copper (Cu) film to serve as wiring between a CMP process for the Cu film and a CMP process for a barrier film.

FIGS. 1 through 7 are cross-sectional views showing respective process steps of a method for fabricating an electronic device of the first embodiment.

Figure 1:
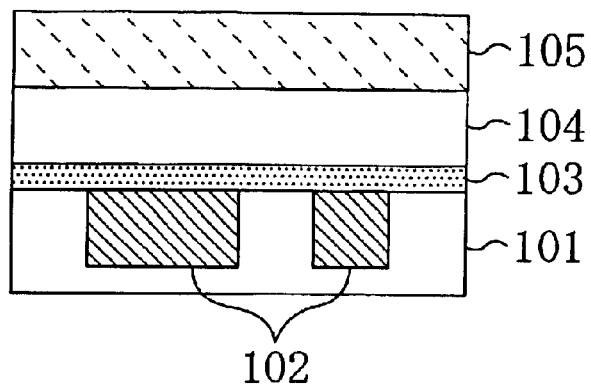
FIG. 1 is a cross-sectional view showing a process step of a method for fabricating an electronic device according to a first embodiment of the present invention.

First, as shown in FIG. 1, a lower wiring layer 102 is formed in an insulating film 101 deposited over, for example, a semiconductor substrate (not shown), and then the surface of the insulating film 101 in which the lower wiring layer 102 has been buried is planarized. Then, an SiN film 103, a $SiO_2$ film 104 and a FSG film 105 are deposited in this order by, for example, a CVD process over the planarized insulating film 101 and the lower wiring layer 102.

Figure 2:
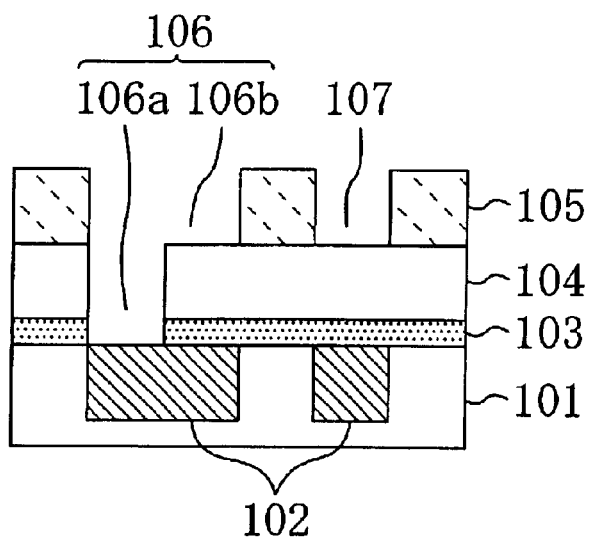
FIG. 2 is a cross-sectional view showing a process step of the method for fabricating the electronic device of the first embodiment.

Next, as shown in FIG. 2, a recess (trench) 106 and a wiring groove 107 are formed in the SiN film 103, the $SiO_2$ film 104 and the FSG film 105 with a process such as a lithographic process or a dry etching process. More specifically, the recess 106 is made up of: a via hole 106a formed through the SiN film 103 and the $SiO_2$ film 104 to reach the lower wiring layer 102; and a wiring groove 106b formed in the FSG film 105 and connected to the via hole 106a. That is to say, the recess 106 has a dual damascene structure. The wiring groove 107 is also formed in the FSG film 105 in the same manner as the wiring groove 106b.

Figure 3:
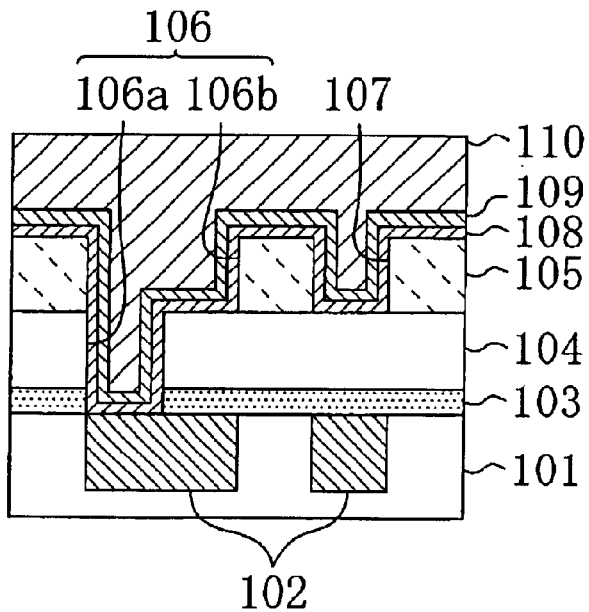
FIG. 3 is a cross-sectional view showing a process step of the method for fabricating the electronic device of the first embodiment.

Thereafter, as shown in FIG. 3, a barrier film 108 and a Cu seed film 109 are deposited by, for example, a physical vapor deposition (PVD) process over the surface of the FSG film 105 and over the walls and the bottoms of the recess 106 and the wiring groove 107 to fill the recess 106 and the wiring groove 107 halfway. Subsequently, a Cu plating film 110 is deposited by, for example, a plating process over the entire surface of the Cu seed film 109 to fill the recess 106 and the wiring groove 107 completely.

Figure 4:
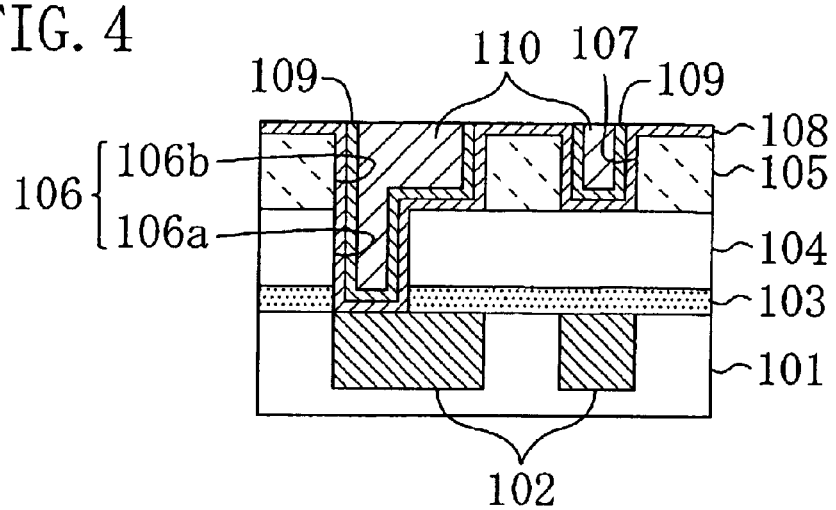
FIG. 4 is a cross-sectional view showing a process step of the method for fabricating the electronic device of the first embodiment.

Then, as shown in FIG. 4, respective parts of the Cu seed film 109 and the Cu plating film 110 extending off the wiring grooves 106b and 107 (i.e., located above the upper surface of the barrier film 108) are removed by, for example, a CMP processes, thereby exposing the barrier film 108 outside the wiring grooves 106b and 107. In this way, the Cu plating film 110 is surrounded by the barrier film 108 and the Cu seed film 109 inside the recess 106 and the wiring groove 107. In this case, the rotational speed and the pressure of a polishing pad, and ingredients in a slurry, for example, are appropriately set so as not to have the barrier film 108 disappear because of excessive polishing. Specifically, a neutral slurry containing, for example, a siliceous solid matter (at a concentration of 5 mass %) and using a hydrogen peroxide solution as an oxidizing agent is used as a slurry, and the number of revolutions (i.e., relative velocity of a polishing pad [time average] to the wafer surface; the same hereinafter) and the pressure (i.e., the pressure with which the polishing pad is pressed against the wafer; the same hereinafter) in polishing are set at, for example, 1015 mm/sec. and 17.7 kPa, respectively.

Figure 5:
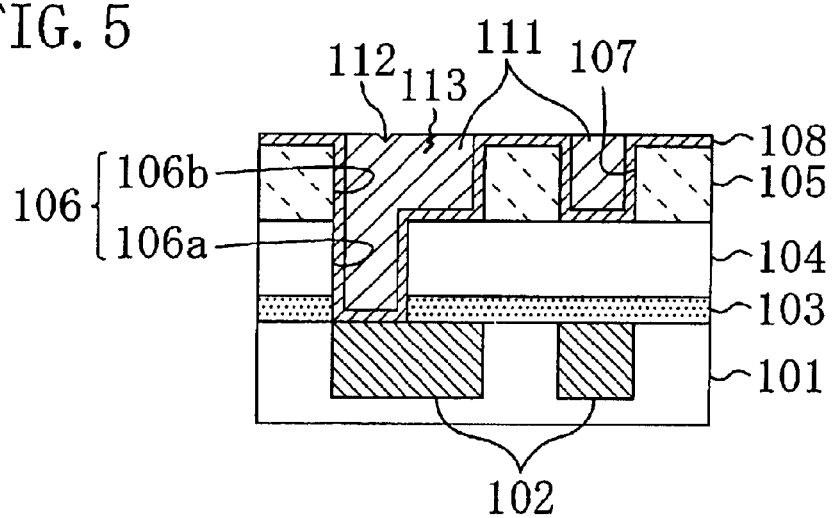
FIG. 5 is a cross-sectional view showing a process step of the method for fabricating the electronic device of the first embodiment.

Then, an annealing process is performed on the remaining Cu seed film 109 and Cu plating film 110. In this case, the annealing process is performed at a temperature of, e.g., 400° C. for, e.g., 120 minutes. In this manner, as shown in FIG. 5, the boundary between the Cu seed film 109 and the Cu plating film 110 disappears, thereby forming a Cu film 111 as a result of merging the Cu seed film 109 and the Cu plating film 110 together. The annealing process completes the crystal growth of the Cu film 111 and also improves the crystallinity of the barrier film 108 of TaN, for example. As a result, the barrier film 108 is more easily cut away in a CMP process performed after the annealing process, thus reducing the torque in the CMP process.

However, this annealing process is performed at a relatively high temperature for a relatively long period of time. Therefore, as shown in FIG. 5, with the crystal growth of the Cu film 111, defects present in the Cu film 111 agglomerate in the surface of the Cu film 111 whose crystal growth is less prevented by the surroundings. As a result, a surface fracture 112 and a crack 113 are formed in the surface of the Cu film 111.

Figure 6:
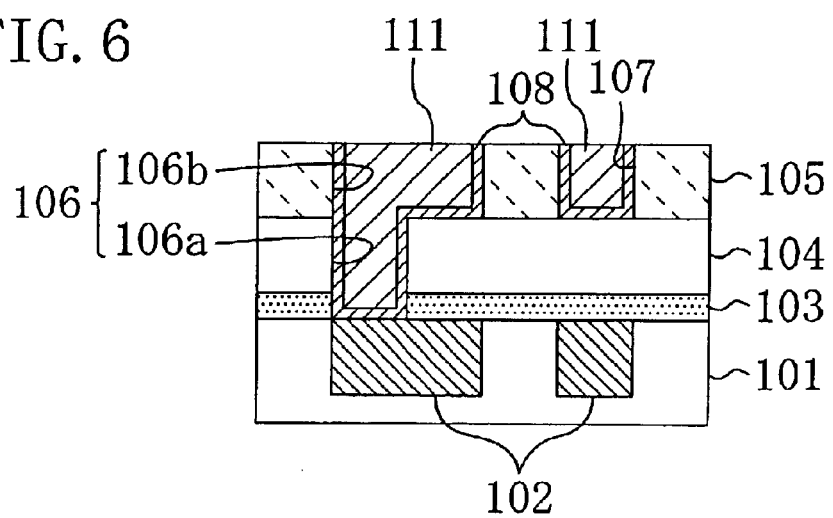
FIG. 6 is a cross-sectional view showing a process step of the method for fabricating the electronic device of the first embodiment.

Then, as shown in FIG. 6, part of the barrier film 108 extending off the wiring grooves 106b and 107 (i.e., located above the upper surface of the FSG film 105) is removed by, for example, a CMP processes, thereby exposing the FSG film 105 outside the wiring grooves 106b and 107. In this case, the rotational speed and the pressure of a polishing pad, and ingredients in a slurry, for example, are appropriately set such that the surface fracture 112 and the crack 113 created in the surface of the Cu film 111 are removed at the same rate as the barrier film 108. Specifically, a neutral slurry containing, for example, a siliceous solid matter (at a concentration of 5 mass %) and using a hydrogen peroxide solution as an oxidizing agent (where the solid matter or a neutral component thereof is made of a different material from the slurry used for the Cu film) is used as a slurry, and the number of revolutions and the pressure in polishing are set at, for example, 761 mm/sec. and 13.7 kPa, respectively. In this manner, the surface fracture 112 and the crack 113 formed in the surface of the Cu film 111 are removed simultaneously with the polishing of the barrier film 108. That is to say, the planarized Cu film 111 with no surface defects.

Figure 7:
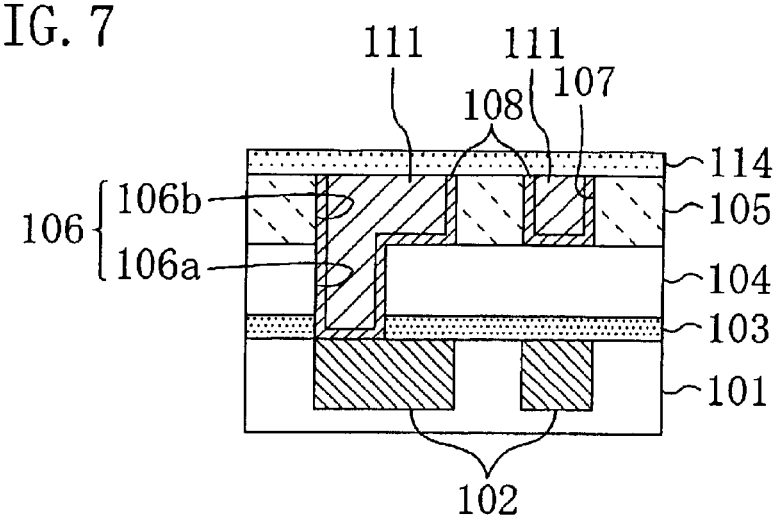
FIG. 7 is a cross-sectional view showing a process step of the method for fabricating the electronic device of the first embodiment.

Lastly, to prevent the surface oxidation of the Cu film 111, a SiN film 114 is formed by, for example, a CVD process over the FSG film 105 and the Cu film 111 as shown in FIG. 7. At this time, surface defects in the Cu film 111 have been eliminated with the polishing process for the barrier film 108 (see FIG. 6), and thus it is possible to deposit the SiN film 114 having a good adhesiveness to the Cu film 111. Through the foregoing process steps, a multilevel wiring structure including the lower wiring layer 102 and an upper wiring layer made of the Cu film 111 buried in the wiring grooves 106b and 107 is formed. In this case, the upper wiring layer and the lower wiring layer 102 are connected to each other via a plug made of the Cu film 111 buried in the via hole 106a. By repeating the same process steps described above (see FIGS. 1 through 7), an electronic device such as a semiconductor device having a multilevel wiring structure with a desired number of levels can be fabricated.

As described above, in the first embodiment, a barrier film 108, a Cu seed film 109 and a Cu plating film 110 are deposited in this order to fill a via hole 106a and wiring grooves 106b and 107 provided in an insulating film. Thereafter, respective parts of the Cu films 109 and 110 extending off the wiring grooves 106b and 107 are removed and then an annealing process is performed on the remaining Cu films 109 and 110, thereby forming a Cu film 111. That is to say, the Cu film is partly removed before an annealing process and the remaining Cu film is subjected to the annealing process, thereby retaining the hardness of the Cu film such that the Cu film is removed relatively evenly (a surface portion of the remaining Cu film is removed in this embodiment) in a removing step after the annealing process. In addition, part of the barrier film 108 extending off the wiring grooves 106b and 107 is removed after the annealing process, thereby eliminating a surface fracture 112 and a crack 113 created in the surface of the Cu film 111 simultaneously with the removal of the barrier film 108. Accordingly, no path for surface diffusion of Cu atoms constituting the Cu film 111 is created, thus preventing deterioration of the electromigration resistance of the wiring structure. As a result, a semiconductor device with a highly-reliable wiring structure can be fabricated with a good yield.

Further, in the first embodiment, surface defects such as the surface fracture 112 created in the Cu film 111 can be removed at a time by the CMP process performed on the barrier film 108 after the annealing process. In other words, it is possible to remove the surface defects without specially setting conditions for the annealing process, thus forming a highly-reliable wiring structure without increasing the number of process steps.

Then, in the first embodiment, more suitable conditions for films to be polished can be selected in respective CMP processes, e.g., conditions suitable for polishing the Cu film are selected in the CMP process before the annealing process whereas conditions suitable for polishing the barrier film are selected in the CMP process after the annealing process. Accordingly, insufficient polishing or excessive polishing is less liable to occur. As a result, polishing can be performed with higher accuracy and a margin required for polishing can be reduced, thereby enabling a flexible process design.

The smaller the design sizes of, for example, the via hole and the wiring groove are, the more defects the Cu film to serve as wiring contains. Accordingly, if the width of the wiring groove or hole in which the Cu film is to be buried is about 0.25 µm or less, the advantages of this embodiment described above are remarkably exhibited. Considering the limitation of burial in a process such as a plating process, the recess in which the Cu film is to be buried preferably has a width of 0.05 µm or more.

In the first embodiment, the Cu film is used as a conductive film for wiring. Alternatively, an Al film, an Ag film or an alloy film containing Cu, Al or Ag may be used. In such a case, the same advantages are obtained. The type of the barrier film is not specifically limited. For example, a TaN barrier film or a Ta barrier film may be used.

In the first embodiment, the Cu films are preferably annealed at a temperature greater than or equal to 200° C. and less than 500° C. Then, the crystal of the resultant Cu film is fully grown inside the wiring groove, for example, thereby densifying the Cu film. Accordingly, further crystal growth of the Cu film does not occur in a heat treatment performed after the formation of the wiring structure, thus preventing the shrinkage of the Cu film and the occurrence of a surface fraction, for example, due to the shrinkage.

Comparative Example

Hereinafter, a method for fabricating an electronic device according to a comparative example will be described with reference to the drawings. A feature of this comparative example (i.e., the difference from the first embodiment) is that an annealing process is performed on a copper (Cu) film to serve as wiring before a CMP process for the Cu film.

Figure 8:
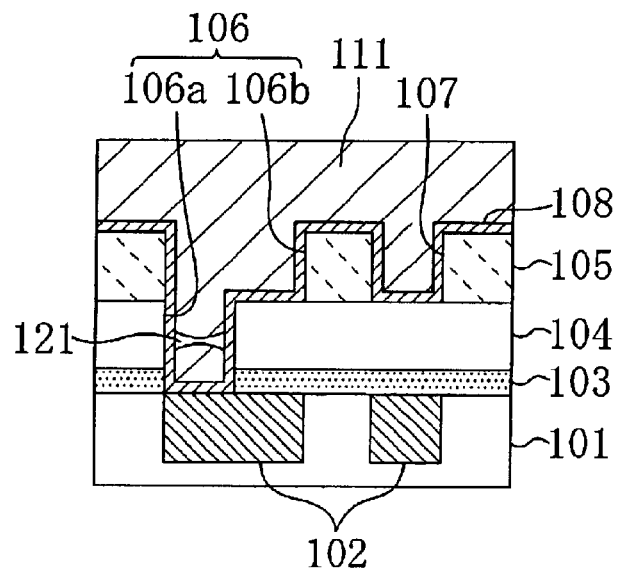
FIG. 8 is a cross-sectional view showing a process step of a method for fabricating an electronic device according to a comparative example.

FIG. 8 is a cross-sectional view showing a process step of a method for fabricating an electronic device according to the comparative example.

As shown in FIG. 8, a SiN film 103, a $SiO_2$ film 104 and a FSG film 105 are formed in this order over an insulating film 101 in which a lower wiring layer 102 is buried. The SiN film 103, the $SiO_2$ film 104 and the FSG film 105 are provided with a recess 106 and a wiring groove 107. More specifically, the recess 106 is made up of a via hole 106a formed through the SiN film 103 and the $SiO_2$ film 104 to reach the lower wiring layer 102; and a wiring groove 106b formed in the FSG film 105 and connected to the via hole 106a. The wiring groove 107 is also formed in the FSG film 105 in the same manner as the wiring groove 106b. A barrier film 108 is formed over the FSG film 105 to fill the recess 106 and the wiring groove 107 halfway. A Cu film (a conducive film for upper wiring) 111 is further formed over the barrier film 108 to fill the recess 106 and the wiring groove 107 completely.

In this comparative example, "annealing" is performed "before the CMP process". Specifically, the Cu film 111 is annealed before the CMP process for removing part of the Cu film 111 that extends off the recess 106 and the wiring groove 107. However, in the comparative example, the annealing performed on the Cu film 111 causes a problem that a void (cavity) 121 is created in a copper film portion to be a metal wiring layer as shown in FIG. 8.

The void 121 is considered to be created because of the following reasons. That is to say, in this comparative example in which "annealing" is performed "before the CMP process", an annealing process is performed at a relatively high temperature of 250 to 400° C. before a CMP process in a state that the Cu film 111 has a high volume. Accordingly, defects (e.g., vacancies at the atomic level existing along a grain boundary) contained in the Cu film 111 just after the annealing agglomerate in the via hole 106a, and in addition, the crystal growth of the Cu film 111 is completed with these defects not eliminated completely. This causes a void 121 in a narrow portion such as a via hole as shown in FIG. 8. As a result, the wiring resistance increases, thus reducing the yield of the semiconductor device and also degrading the reliability of the semiconductor device. Such a phenomenon is more remarkable when the width of a recess such as the wiring groove or the via hole is 0.25 µm or less.

Figure 9:
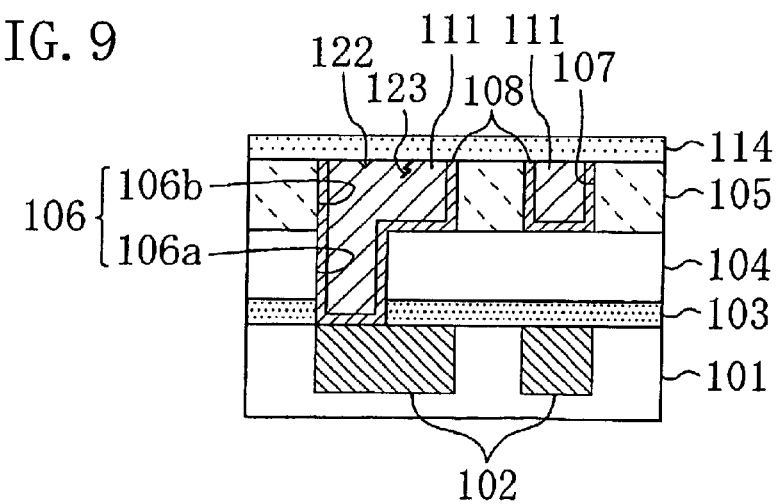
FIG. 9 is a cross-sectional view showing a process step of the method for fabricating an electronic device of the comparative example.

If the annealing process is performed at a low temperature (e.g., about 150° C.) in order to prevent the occurrence of a void in the comparative example, another problem occurs as shown in FIG. 9. Specifically, in such a case, part of the Cu film 111 extending off the recess 106 and the wiring groove 107 is removed by a CMP process after the annealing process, so that an upper wiring layer made of the Cu film 111 can be formed without any void as shown in FIG. 9. At this point of time, no defects such as a fracture are present in the surface of the Cu film 111. However, since the annealing process on the Cu film 11 1is performed at a low temperature, the crystal growth of the Cu film 111 and the removal of the defects from the Cu film 111 are both insufficient at this time. Accordingly, the defects in the Cu film 111 agglomerate in the surface of the Cu film 111 already planarized and, in addition, the Cu film 111 shrinks unevenly during a heat treatment performed after the formation of the upper wiring film or the SiN film 114 protecting the upper wiring film. As a result, a surface fracture 122 and a crack 123 are created as shown in FIG. 9.

Embodiment 2

Hereinafter, a method for fabricating an electronic device according to a second embodiment of the present invention will be described with reference to the drawings. This embodiment is characterized in that two CMP (Cu-CMP) processes are performed on a Cu film to serve as wiring and that an annealing process is performed on the Cu film between the Cu-CMP processes.

FIGS. 10A through 10D are cross-sectional views showing respective process steps of a method for fabricating an electronic device of the second embodiment.

Figure 10A:
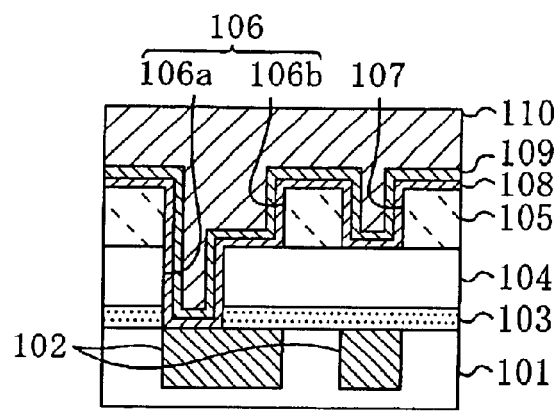
FIGS. 10A through 10D are cross-sectional views showing respective process steps of a method for fabricating an electronic device according to a second embodiment of the present invention.

First, in the same manner as in the first embodiment (see FIGS. 1 through 3), as shown in FIG. 10A, a lower wiring layer 102 is formed in an insulating film 101 deposited over, for example, a semiconductor substrate (not shown), and then the surface of the insulating film 101 in which the lower wiring layer 102 has been buried is planarized. Then, an SiN film 103, a $SiO_2$ film 104 and a FSG film 105 are deposited in this order by, for example, a CVD process over the planarized insulating film 101 and the lower wiring layer 102. Next, a recess 106 and a wiring groove 107 are formed in the SiN film 103, the $SiO_2$ film 104 and the FSG film 105 with a process such as a lithographic process or a dry etching process. More specifically, the recess 106 is made up of: a via hole 106a formed through the SiN film 103 and the $SiO_2$ film 104 to reach the lower wiring layer 102; and a wiring groove 106b formed in the FSG film 105 and connected to the via hole 106a. That is to say, the recess 106 has a dual damascene structure. The wiring groove 107 is also formed in the FSG film 105 in the same manner as the wiring groove 106b. Thereafter, a barrier film 108 and a Cu seed film 109 are deposited by, for example, a PVD process over the surface of the FSG film 105 and over the walls and the bottoms of the recess 106 and the wiring groove 107 to fill the recess 106 and the wiring groove 107 halfway. Subsequently, a Cu plating film 110 is deposited by, for example, a plating process over the entire surface of the Cu seed film 109 to fill the recess 106 and the wiring groove 107 completely.

Figure 10B:
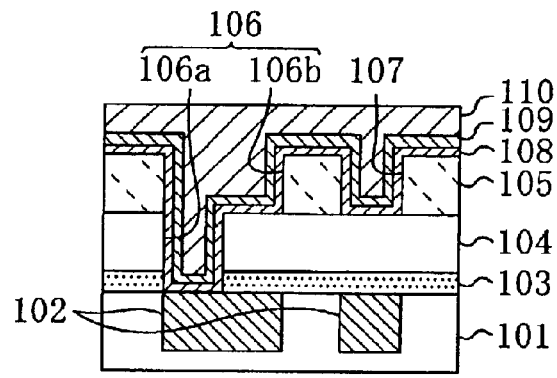

Then, as shown in FIG. 10B, part of the Cu plating film 110 extending off the wiring grooves 106b and 107 (i.e., located above the upper surface ofthe barrier film 108) is removed partially by, for example, a CMP process. In this case, a neutral slurry containing, for example, a siliceous solid matter (at a concentration of 5 mass %) and using a hydrogen peroxide solution as an oxidizing agent is used as a slurry, and the number of revolutions and the pressure in polishing are set at, for example, 1015 mm/sec. and 17.7 kPa, respectively.

Figure 10C:
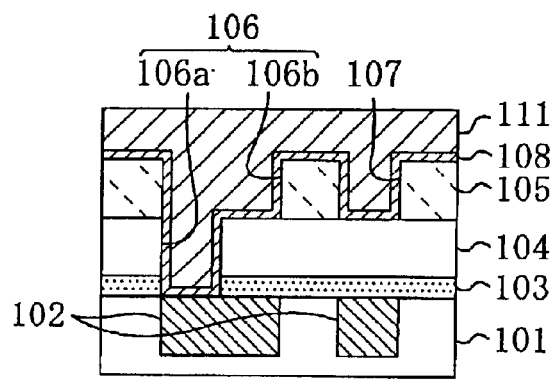

Thereafter, an annealing process is performed on the Cu seed film 109 and the remaining Cu plating film 110. In this case, the annealing process is performed at a temperature of, e.g., 400° C. for, e.g., 120 minutes. In this manner, as shown in FIG. 10C, the boundary between the Cu seed film 109 and the Cu plating film 110 disappears, thereby forming a Cu film 111 as a result of merging the Cu seed film 109 and the Cu plating film 110 together. The annealing process completes the crystal growth of the Cu film 111.

Figure 10D:
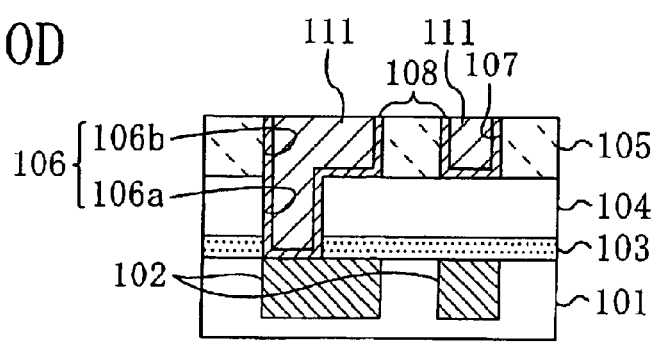

Subsequently, as shown in FIG. 10D, respective parts of the Cu film 111 and the barrier film 108 extending off the wiring grooves 106b and 107 (i.e., located above the upper surface of the FSG film 105) are removed by, for example, a CMP process, thereby exposing the surface of the FSG film 105 and planarizing the surface of the FSG film 105. In this case, specific CMP conditions are as follows. In the CMP for the Cu film 111, a neutral slurry containing, for example, a siliceous solid matter (at a concentration of 5 mass %) and using a hydrogen peroxide solution as an oxidizing agent is used as a slurry, and the number of revolutions and the pressure in polishing are set at, for example, 1015 mm/sec. and 17.7 kPa, respectively. In the CMP for the barrier film 108, a neutral slurry containing, for example, a siliceous solid matter (at a concentration of 5 mass %) and using a hydrogen peroxide solution as an oxidizing agent (where the solid matter or a neutral component thereof is made of a different material from the slurry used for the Cu film) is used as a slurry, and the number of revolutions and the pressure in polishing are set at 761 mm/sec. and 13.7 kPa, respectively.

Lastly, in the same manner as in the first embodiment (see FIG. 7), in order to prevent the surface oxidation of the Cu film 111, a SiN film is formed by, for example, a CVD process over the FSG film 105 and the Cu film 111.

As described above, in the second embodiment, a barrier film 108, a Cu seed film 109 and a Cu plating film 110 are deposited in this order to fill a via hole 106a and wiring grooves 106b and 107 provided in an insulating film. Thereafter, part of the Cu film 110 extending off the wiring grooves 106b and 107 are removed partially and then an annealing process is performed, thereby forming a Cu film 111 made of the Cu film 109 and the remaining the Cu film 110. That is to say, the Cu film is partly removed before an annealing process and the remaining Cu film is subjected to the annealing process, thereby retaining the hardness of the Cu film such that the Cu film is removed relatively evenly in a removing step after the annealing process. In addition, respective parts of the Cu film 111 and the barrier film 108 extending off the wiring grooves 106b and 107 are removed after the annealing process. Thus, even if surface defects such as a fracture occur in the surface of the Cu film 111 during the annealing process, the removal of the Cu film 111 simultaneously removes the surface defects. Accordingly, no path for surface diffusion of Cu atoms constituting the Cu film 111 is created, thus preventing deterioration of the electromigration resistance of the wiring structure. As a result, a semiconductor device with a highly-reliable wiring structure can be fabricated with a good yield.

Further, in the second embodiment, even if surface defects occur in the Cu film 111, the surface defects can be removed at a time by a CMP process performed after the annealing process. In other words, it is possible to remove the surface defects without specially setting conditions for the annealing process, thus forming a highly-reliable wiring structure without increasing the number of process steps.

Then, in the second embodiment, even if the surface fracture or the crack is enlarged resulting from film properties of the Cu film, the surface of the Cu film can be further planarized because the amount of removal of the Cu film is set large in the CMP process after the annealing process.

The smaller the design sizes of, for example, the via hole and the wiring groove are, the more defects the Cu film to serve as wiring contains. Accordingly, if the width of the wiring groove or hole in which the Cu film is to be buried is about 0.25 μm or less, the advantages of this embodiment described above are remarkably exhibited. Considering the limitation of burial in a process such as a plating process, for example, the recess in which the Cu film is to be buried preferably has a width of 0.05 μm or more.

In the second embodiment, the Cu film is used as a conductive film for wiring. Alternatively, an Al film, an Ag film or an alloy film containing Cu, Al or Ag may be used. In such a case, the same advantages are obtained. The type of the barrier film is not specifically limited. For example, a TaN barrier film or a Ta barrier film may be used.

In the second embodiment, the annealing process on the Cu film is preferably performed at a temperature greater than or equal to 200° C. and less than 500° C. Then, the crystal of the Cu film is fully grown inside the wiring groove, for example, thereby densifying the Cu film. Accordingly, further crystal growth of the Cu film does not occur in a heat treatment performed after the formation of the wiring structure, thus preventing the shrinkage of the Cu film and the occurrence of a surface fraction, for example, due to the shrinkage.

Embodiment 3

Hereinafter, a method for fabricating an electronic device according to a third embodiment of the present invention will be described with reference to the drawings. This embodiment is characterized in that an annealing process is performed on a Cu film to serve as wiring after respective CMP processes for the Cu film and a barrier film, and that a CMP process for removing at least the Cu film is performed again after the annealing process.

FIGS. 11A through 11D are cross-sectional views showing respective process steps of a method for fabricating an electronic device of the third embodiment.

Figure 11A:
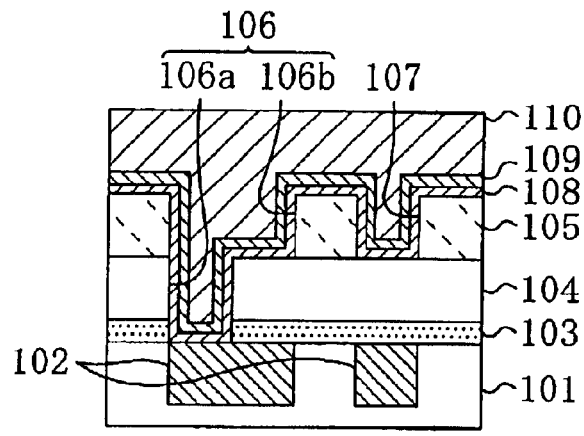
FIGS. 11A through 11D are cross-sectional views showing respective process steps of a method for fabricating an electronic device according to a third embodiment of the present invention.

First, in the same manner as in the first embodiment (see FIGS. 1 through 3), as shown in FIG. 11A, a lower wiring layer 102 is formed in an insulating film 101 deposited over, for example, a semiconductor substrate (not shown), and then the surface of the insulating film 101 in which the lower wiring layer 102 has been buried is planarized. Then, an SiN film 103, a $SiO_2$ film 104 and a FSG film 105 are deposited in this order by, for example, a CVD process over the planarized insulating film 101 and the lower wiring layer 102. Next, a recess 106 and a wiring groove 107 are formed in the SiN film 103, the $SiO_2$ film 104 and the FSG film 105 with a process such as a lithographic process or a dry etching process. More specifically, the recess 106 is made up of: a via hole 106a formed through the SiN film 103 and the $SiO_2$ film 104 to reach the lower wiring layer 102; and a wiring groove 106b formed in the FSG film 105 and connected to the via hole 106a. That is to say, the recess 106 has a dual damascene structure. The wiring groove 107 is also formed in the FSG film 105 in the same manner as the wiring groove 106b. Thereafter, a barrier film 108 and a Cu seed film 109 are deposited by, for example, a PVD process over the surface of the FSG film 105 and over the walls and the bottoms of the recess 106 and the wiring groove 107 to fill the recess 106 and the wiring groove 107 halfway. Subsequently, a Cu plating film 110 is deposited by, for example, a plating process over the entire surface of the Cu seed film 109 to fill the recess 106 and the wiring groove 107 completely.

Figure 11B:
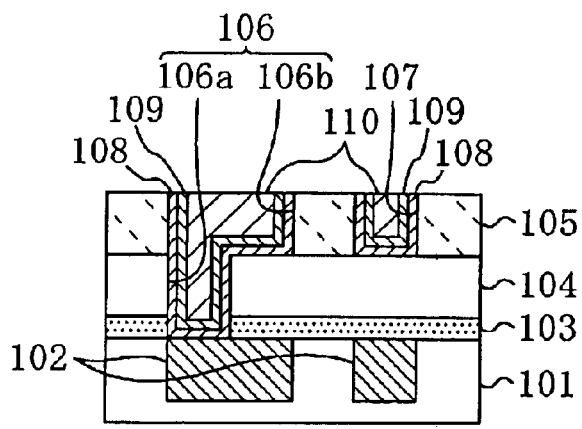

Then, as shown in FIG. 11B, respective parts of the Cu seed film 109, the Cu plating film 110 and the barrier film 108 extending off the wiring grooves 106b and 107 (i.e., located above the upper surface of the FSG film 105) are removed by, for example, a CMP process, thereby exposing the surface of the FSG film 105 and planarizing the surface of the FSG film 105. In this case, specific CMP conditions are as follows. In the CMP for the Cu films 109 and 110, a neutral slurry containing, for example, a siliceous solid matter (at a concentration of 5 mass %) and using a hydrogen peroxide solution as an oxidizing agent is used as a slurry, and the number of revolutions and the pressure in polishing are set at, for example, 1015 mm/sec. and 17.7 kPa, respectively. In the CMP for the barrier film 108, a neutral slurry containing, for example, a siliceous solid matter (at a concentration of 5 mass %) and using a hydrogen peroxide solution as an oxidizing agent (where the solid matter or a neutral component thereof is made of a different material from the slurry used for the Cu film) is used as a slurry, and the number of revolutions and the pressure in polishing are set at 761 mm/sec. and 13.7 kPa, respectively.

Figure 11C:
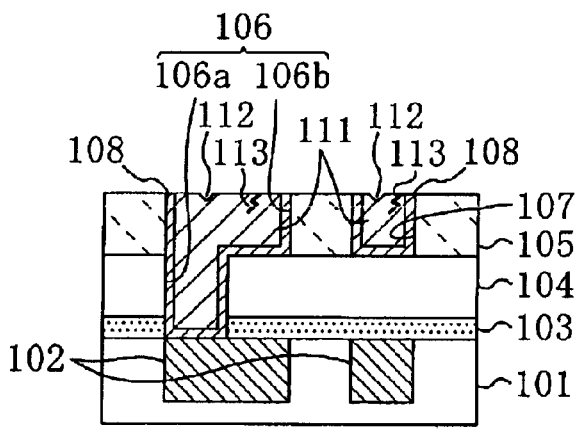

Thereafter, an annealing process is performed on the remaining Cu seed film 109 and Cu plating film 110. In this case, the annealing process is performed at a temperature of, e.g., 400° C. for, e.g., 120 minutes. In this manner, as shown in FIG. 11C, the boundary between the Cu seed film 109 and the Cu plating film 110 disappears, thereby forming a Cu film 111 as a result of merging the Cu seed film 109 and the Cu plating film 110 together. The annealing process completes the crystal growth of the Cu film 111.

However, this annealing process is performed at a relatively high temperature for a relatively long period of time. Therefore, as shown in FIG. 11C, with the crystal growth of the Cu film 111, defects present in the Cu film 111 agglomerate in the surface of the Cu film 111 whose crystal growth is less prevented by the surroundings. As a result, a surface fracture 112 and a crack 113 are formed in the surface of the Cu film 111.

Figure 11D:
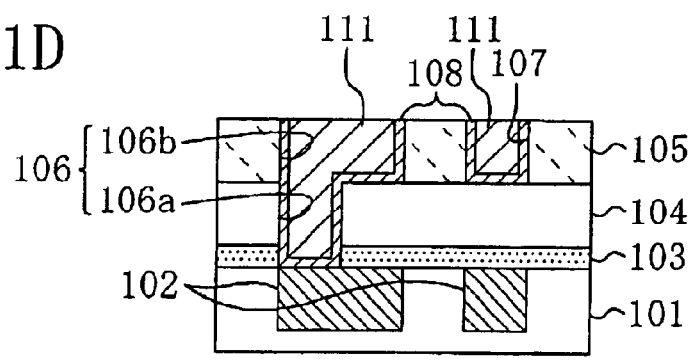

Subsequently, as shown in FIG. 11D, a CMP process, for example, is performed to remove the surface fracture 112 and the crack 113 simultaneously with a surface portion of the Cu film 111. In this case, conditions for the CMP process are not limited so long as at least part of the Cu film is removed. Specifically, CMP conditions such as those for the Cu films 109 and 110 in the CMP process shown in FIG. 11B or those for the barrier film 108 may be used.

Then, in the step of removing a surface portion of the Cu film 111, even if conditions suitable for removing an insulating film such as an oxide film is selected, other than the conditions suitable for removing the Cu film and the conditions suitable for removing the barrier film, it is possible to obtain the effect of smoothing the surface of the Cu film 111. Specifically, in the case where an insulating film (the FSG film 105 in this embodiment) around the Cu film 111 to serve as wiring is removed by CMP using the conditions suitable for removing an oxide film, a strong force is also applied to the Cu film 111, so that the surface of the Cu film 111 is planarized simultaneously with the removal of the FSG film 105.

As described above, in the third embodiment, a barrier film 108, a Cu seed film 109 and a Cu plating film 110 are deposited in this order to fill a via hole 106a and wiring grooves 106b and 107 provided in an insulating film. Thereafter, respective parts of the Cu films 109 and 110 and the barrier film 108 extending off the wiring grooves 106b and 107 are removed and then an annealing process is performed, thereby forming a Cu film 111 made of the remaining Cu films 109 and 110. That is to say, the Cu film is partly removed before an annealing process and the remaining Cu film is subjected to the annealing process, thereby retaining the hardness of the Cu film such that the Cu film is removed relatively evenly in a removing step after the annealing process (a surface portion of the remaining Cu film is removed in this embodiment). In addition, a surface portion of the Cu film 111 is removed after the annealing process, a surface fracture 112 and a crack 113 that have occurred in the surface of the Cu film 111 during the annealing process are removed accordingly. Therefore, no path for surface diffusion of Cu atoms constituting the Cu film 111 is created, thus preventing deterioration of the electromigration resistance of the wiring structure. As a result, a semiconductor device with a highly-reliable wiring structure can be fabricated with a good yield.

Further, in the third embodiment, surface defects such as the surface fracture 112 caused in the Cu film 111 can be removed at a time by a CMP process performed after the annealing process. In other words, it is possible to remove the surface defects without specially setting conditions for the annealing process, thus forming a highly-reliable wiring structure without increasing the number of process steps.

The smaller the design sizes of, for example, the via hole and the wiring groove are, the more defects the Cu film to serve as wiring contains. Accordingly, if the width of the wiring groove or hole in which the Cu film is to be buried is about 0.25 $\mu$m or less, the advantages of this embodiment described above are remarkably exhibited. Considering the limitation of burial in a process such as a plating process, the recess in which the Cu film is to be buried preferably has a width of 0.05 $\mu$m or more.

In the third embodiment, the Cu film is used as a conductive film for wiring. Alternatively, an Al film, an Ag film or an alloy film containing Cu, Al or Ag may be used. In such a case, the same advantages are obtained. The type of the barrier film is not specifically limited. For example, a TaN barrier film or a Ta barrier film may be used.

In the third embodiment, the annealing process on the Cu film is preferably performed at a temperature greater than or equal to 200° C. and less than 500° C. Then, the crystal of the Cu film is fully grown inside the wiring groove, for example, thereby densifying the Cu film. Accordingly, further crystal growth of the Cu film does not occur in a heat treatment performed after the formation of the wiring structure, thus preventing the shrinkage of the Cu film and the occurrence of a surface fraction, for example, due to the shrinkage.

Embodiment 4

Hereinafter, a method for fabricating an electronic device according to a fourth embodiment of the present invention will be described with reference to the drawings. This embodiment is characterized in that the timing of and the number of CMP processes for forming a wiring structure are selectively set in accordance with the width of a recess to be a wiring groove, for example. This embodiment has such a feature because of the following reasons.

Specifically, in most of the multilevel wiring structures, the wiring width is smaller at lower-level wiring whereas the wiring width is relatively larger in upper-level wiring, in general. Accordingly, if wiring is formed by burying conductive films in, for example, wiring grooves, drawbacks such as surface defects are more liable to occur at lower-level wiring with narrow wiring grooves. In addition, since annealing processes are performed in forming respective upper-level wirings, lower-level wiring is subjected to the plurality of annealing processes accordingly after the formation of the lower-level wiring itself. Therefore, a heat load is applied to the lower-level wiring every time each of the annealing processes is performed. That is to say, a heat load is applied to lower-level wiring at a larger number of times. This causes a conductive film for wiring to be easily changed, thereby increasing the probability of occurrence of drawbacks. In consideration of such circumstances, in this embodiment, an annealing process is performed on a Cu film to serve as wiring between a CMP process for the Cu film and a CMP process for a barrier film as in the first embodiment, in forming wiring having a narrow wiring groove, for example, or located at a lower level. On the other hand, in forming wiring having a wide wiring groove, for example, or located at an upper level, an importance is placed on the simplification of processes so that "a CMP process" is performed only "before an annealing process".

Figure 12:
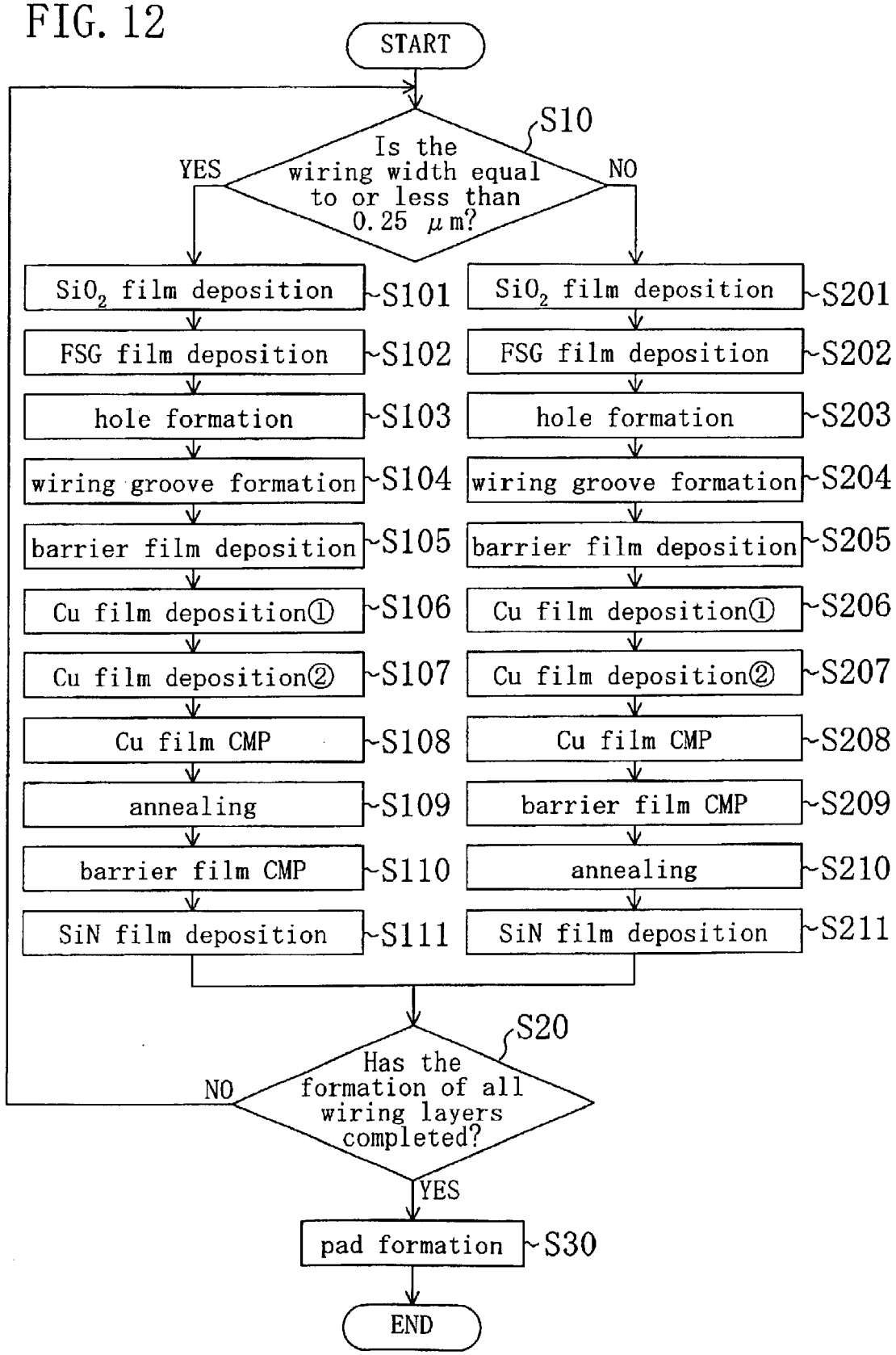
FIG. 12 is a flowchart showing a method for fabricating an electronic device according to a fourth embodiment of the present invention.
Figure 13A:
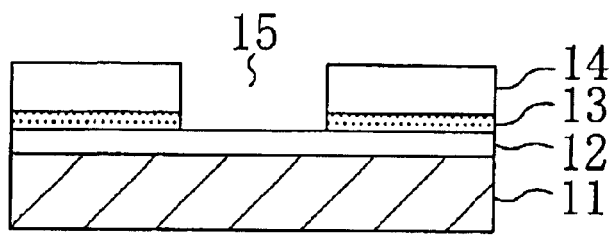
FIGS. 13A through 13E are cross-sectional views showing respective process steps of a method for forming a known wiring structure.
Figure 13B:
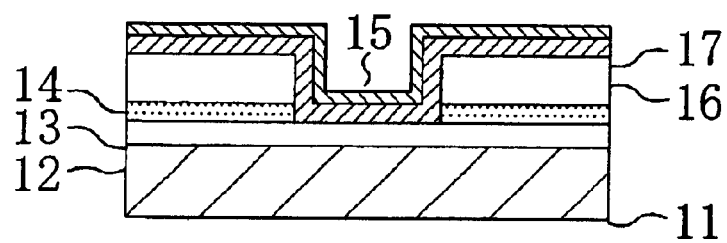
Figure 13C:
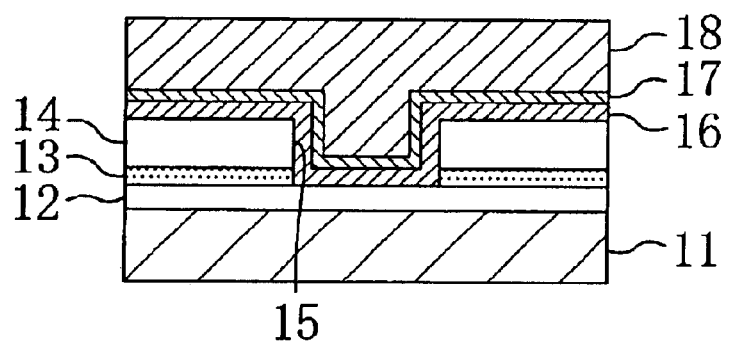
Figure 13D:
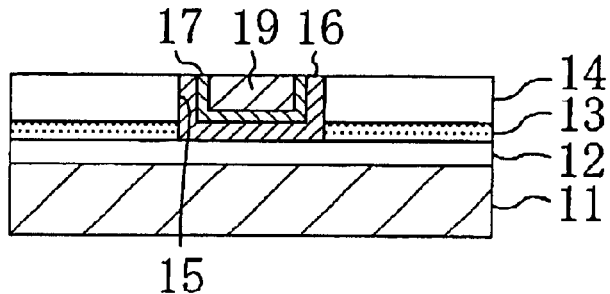
Figure 13E:
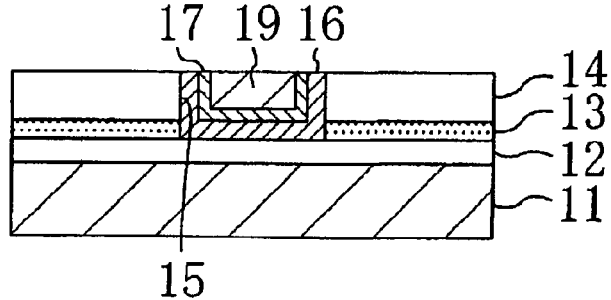
Figure 14A:
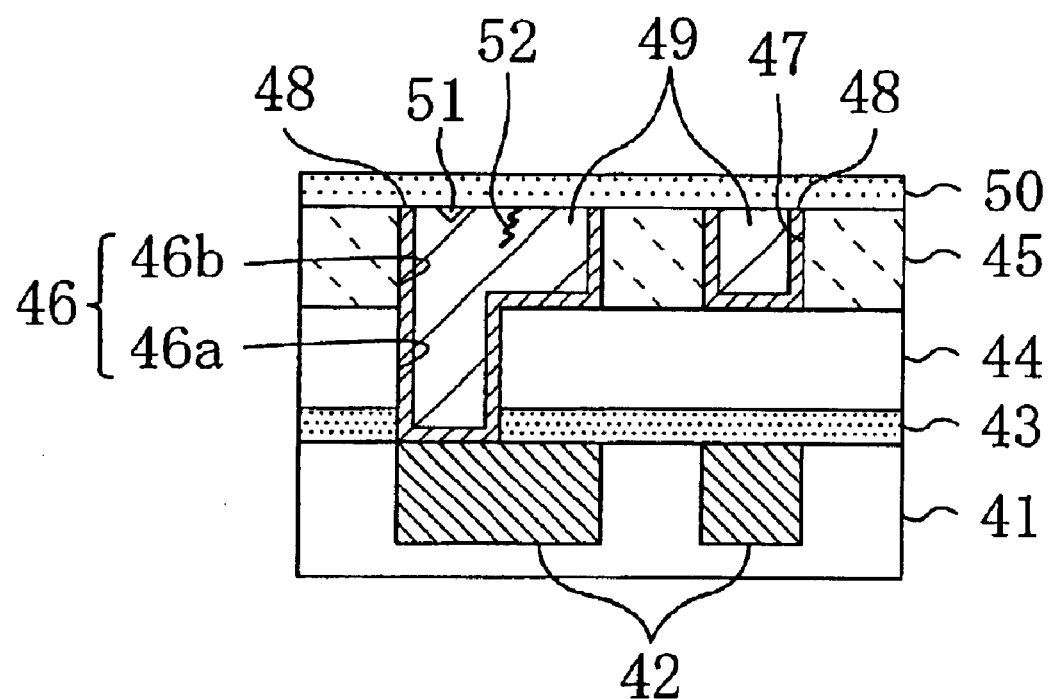
FIG. 14 is a view for explaining a problem in a known method for forming wiring structure.

Hereinafter, an example of formation of a multilevel structure for buried copper wiring will be described specifically with reference to a flowchart shown in FIG. 12.

First, in step S10, it is determined whether the width of wiring to be formed (i.e., the width of a wiring groove or the diameter of a via hole or a contact hole) is 0.25 $\mu$m or less.

If the wiring width is 0.25 $\mu$m or less, the same method as in the first embodiment (see FIGS. 1 through 7) is used. That is to say, an annealing process is performed after a CMP process for a Cu film and before a CMP process for a barrier film, thereby forming wiring.

Specifically, in Step S101, a SiO$_2$ film, for example, is deposited over a substrate, and then in Step S102, a FSG film, for example, is deposited over the SiO$_2$ film. Subsequently, in Step S103, a hole is formed in these films.

Next, in Step S104, a wiring groove connected to the hole is formed in the FSG film, and then in Steps S105 and S106, a barrier film and a Cu seed film are deposited in this order over the entire surface of the FSG film to fill the hole and the wiring groove halfway. Thereafter, in Step S107, a Cu plating film is deposited over the Cu seed film to fill the hole and the wiring groove completely.

Subsequently, in Step S108 (a Cu-CMP process), a CMP process is performed to remove the respective parts of the Cu plating film and the Cu seed film extending off the wiring groove and to expose part of the barrier film extending off the wiring groove. Subsequently, in Step S109, the remaining Cu films are subjected to an annealing process. In this way, the Cu seed film and the Cu plating film are merged together, and in addition, the crystallization of the Cu film as a result of the mergence is completed. That is to say, the Cu film to serve as wiring is densified.

Then, in Step S110 (a barrier CMP process), a CMP process is performed to remove part of the barrier film extending off the wiring groove, thereby forming a buried Cu wire in the FSG film and planarizing the surface of the FSG film. Thereafter, in Step S111, a SiN film is deposited over the planarized FSG film in which the Cu wire is buried. In this manner, the oxidation of the Cu wire is prevented.

If the diameter of the hole or the width of the wiring groove is 0.25 $\mu$m or less, i.e., if the wiring pattern is minute, defects contained in the Cu film agglomerate in the surface of the Cu film, resulting in that the crystal growth of the Cu film is completed with a surface fracture and a crack created in the Cu film in the annealing process (Step S109). On the contrary, in this embodiment, a CMP process (Step S110) is performed on the barrier film as the second CMP process after the annealing process, thereby simultaneously removing a surface fracture and a crack created in the surface of the Cu film and the barrier film.

On the other hand, in Step S10, if it is determined that the width of wiring to be formed is greater than 0.25 $\mu$m, both of the Cu-CMP process and the barrier CMP process are performed (i.e., the Cu plating film, the Cu seed film and the barrier film are successively removed) before an annealing process, thereby forming wiring. In other words, if the diameter of the hole or the width of the wiring groove is greater than 0.25 $\mu$m, no CMP process is performed after the annealing process in forming a wiring structure.

Specifically, in Steps S201 through S207, after a SiO$_2$ film and a FSG film, for example, have been deposited over a substrate, a hole is formed in these films, and then a wiring groove is formed in the FSG film to connect to the hole, as in Steps S101 through S107. Then, a barrier film and a Cu seed film are deposited in this order over the entire surface of the FSG film to fill the hole and the wiring groove halfway. Thereafter, a Cu plating film is deposited over the Cu seed film to fill the hole and the wiring groove completely.

Then, in Steps S208 and S209 (a CMP process), respective parts of the Cu plating film, the Cu seed film and the barrier film extending off the wiring groove are removed sequentially by a CMP process, thereby forming a buried Cu wire in the FSG film and planarizing the surface of the FSG film. Thereafter, in Step S210, an annealing process is performed on the remaining Cu films. In this way, the Cu seed film and the Cu plating film are merged together, and the crystallization of the merged Cu film is completed. That is to say, the Cu film to serve as wiring is densified. Thereafter, in Step S211, a SiN film is deposited over the planarized FSG film in which the Cu wire is buried. In this way, the oxidization of the Cu wire is prevented.

If the diameter of the hole or the width of the wiring groove is greater than 0.25 $\mu$m, i.e., if the wiring width is larger, the area from which defects contained in the conductive film for wiring (Cu film) are released increases accordingly. Therefore, as the wiring width increases, the amount of defects contained in the Cu film increases, whereas the surface area of the wiring also increases, so that the defects in the Cu film are more easily released. Accordingly, even if the annealing process (Step 210) is performed at high temperature, the defects in the Cu film are released before the completion of the crystal growth of the entire Cu film to serve as wire. As a result, substantially no surface fracture and crack occurs in the Cu film, i.e., in the wiring. That is to say, if the diameter of the hole or the width of the wiring groove is greater than 0.25 $\mu$m, it is no more necessary to perform the second CMP process for removing the surface defects after the annealing process.

After the processes in Steps S101 through S111 or the processes in Steps S201 through S211 have been completed, it is determined whether the formation of all the wiring layers is completed in Step 20. If a wiring layer yet to be formed is still exist, the process returns to Step S10. If the formation of all the wiring layers has been completed, the process proceeds to Step S30 in which pads are formed on the uppermost wiring layer and finishing heat treatment is performed.

As described above, in the fourth embodiment, the method of the first embodiment is used to form wiring in a recess having a relatively small width of 0.25 $\mu$m or less, for example, so that the same advantages as in the first embodiment are obtained. On the other hand, in forming wiring in a recess having a relatively large width greater than 0.25 $\mu$m, for example, "a CMP process" is performed only "before annealing", considering that defects are easily released from a conductive film inside the wide recess. In this manner, it is possible to achieve a wiring structure having neither a void nor a surface fracture while suppressing the complication of the process.

That is to say, in the fourth embodiment, the timing or the number of CMP processes for forming a wiring structure are selectively set in accordance with the wiring width. Therefore, it is possible to form a desired wiring structure without complicating the process.

In the fourth embodiment, "a CMP process" is performed only "before annealing" to form wiring in a wide recess. Alternatively, "a CMP process" may be performed only "after annealing".

In the fourth embodiment, the Cu film is used as a conductive film for wiring. Alternatively, an Al film, an Ag film or an alloy film containing Cu, Al or Ag may be used. In such a case, the same advantages are obtained. The type of the barrier film is not specifically limited. For example, a TaN barrier film or a Ta barrier film may be used.

In the fourth embodiment, the method of the first embodiment is used to form wiring with a narrow wiring groove, for example, or lower-level wiring. Alternatively, the method of the second or third embodiment may be used.

What is claimed is:

1. A method for forming a wiring structure, the method comprising the steps of:

forming a recess in an insulating film;

depositing a conductive film over the insulating film such that the recess is filled with the conductive film;

performing a heat treatment on the conductive film;

partly removing the conductive film before the step of performing the heat treatment is performed; and partly removing the conductive film after the step of performing the heat treatment so as to remove at least a portion of the conductive film positioned over the recess.

2. The method of claim 1, including the step of depositing a barrier film over the insulating film so that the recess is partially filled with the barrier film, before the step of depositing the conductive film is performed, wherein the step of partly removing the conductive film before the step of performing the heat treatment includes the step of removing part of the conductive film located outside the recess, thereby exposing part of the barrier film located outside the recess, and the step of partly removing the conductive film after the step of performing the heat treatment includes the step of removing the part of the barrier film located outside the recess and a surface portion of the remaining conductive film.

3. The method of claim 2, wherein the conductive film is made of copper or an alloy containing copper, and the barrier film is made of Ta or TaN.

4. The method of claim 1, including the step of depositing a barrier film over the insulating film so that the recess is partially filled with the barrier film, before the step of depositing the conductive film is performed, wherein the step of partly removing the conductive film before the step of performing the heat treatment includes the step of partially removing part of the conductive film located outside the recess, and the step of partly removing the conductive film after the step of performing the heat treatment includes the step of removing the part of the conductive film remaining outside the recess and part of the barrier film located outside the recess.

5. The method of claim 4, wherein the conductive film is made of copper or an alloy containing copper, and the barrier film is made of Ta or TaN.

6. The method of claim 1, including the step of depositing a barrier film over the insulating film so that the recess is partially filled with the barrier film, before the step of depositing the conductive film is performed, wherein the step of partly removing the conductive film before the step of performing the heat treatment includes the step of removing part of the conductive film located outside the recess and part of the barrier film located outside the recess, and the step of partly removing the conductive film after the step of performing the heat treatment includes the step of removing a surface portion of the remaining conductive film.

7. The method of claim 6, wherein the conductive film is made of copper or an alloy containing copper, and the barrier film is made of Ta or TaN.

8. The method of claim 1, wherein the recess includes a via hole, and a wiring groove formed on the via hole and connected to the via hole.

9. The method of claim 1, wherein the heat treatment is performed at a temperature higher than or equal to 200° C. and less than 500° C.

10. The method of claim 1, wherein the recess has a width of 0.25 $\mu$m or less.

11. The method of claim 1, wherein the conductive film is made of copper or an alloy containing copper.

12. The method of claim 1, wherein in the steps of partly removing the conductive film, a chemical mechanical polishing process is used.

13. A method for fabricating an electronic device including a first wiring structure and a second wiring structure, a method for forming the first wiring structure comprising the steps of:

forming a first recess in a first insulating film;

depositing a first conductive film over the first insulating film such that the first recess is filled with the first conductive film;

performing a heat treatment on the first conductive film;

partly removing the first conductive film before the step of performing the heat treatment is performed; and partly removing the first conductive film after the step of performing the heat treatment has been performed, a method for forming the second wiring structure comprising the steps of:

forming a second recess in a second insulating film;

depositing a second conductive film over the second insulating film such that the second recess is filled with the second conductive film;

performing a heat treatment on the second conductive film; and removing part of the second conductive film located outside the second recess, wherein the second recess has a width greater than the first recess.

14. The method of claim 13, wherein the first recess has a width of 0.25 $\mu$m or less, and the second recess has a width greater than 0.25 $\mu$m.

15. A method for forming a wiring structure comprising the steps of:

forming a recess in an insulating film formed on a substrate;

depositing a conductive film over the insulating film such that the recess is filled with the conductive film;

performing a heat treatment on the conductive film; and selectively subjecting the conductive film to one or more steps of removing part of the conductive film oustside the recess, the number of removing steps being set in accordance with the width of the recess.

16. The method of claim 15, wherein if the recess has a width that is equal to or less than a predetermined value, then the conductive film is subject to a first removing step before the heat treatment and a second removing step after the heat treatment.

17. The method of claim 16, wherein the predetermined value is 0.25 μm.

18. The method of claim 16, wherein if the recess has a width greater than the predetermined value, then the conductive film is subject to a removing step before the heat treatment.

19. The method of claim 18, wherein the predetermined value is 0.25 μm.

20. The method claim 15, wherein if the recess has a width greater than a predetermined value, then the conductive film is subject to a removing step before the heat treatment.

21. The method of claim 20, wherein the predetermined value is 0.25 μm.

* * * * *